US012738852B2

(12) United States Patent
Cacciotto

(10) Patent No.: US 12,738,852 B2
(45) Date of Patent: Sep. 15, 2026

(54) DETECTING TRANSFORMER SATURATION IN SWITCHED-MODE POWER SUPPLIES

(71) Applicant: STMicroelectronics International N.V., Geneva (CH)

(72) Inventor: Fabio Cacciotto, Catania (IT)

(73) Assignee: STMicroelectronics S.r.l., Agrate Brianza (IT)

(*) Notice: Subject to any disclaimer, the term of this patent is extended or adjusted under 35 U.S.C. 154(b) by 168 days.

(21) Appl. No.: 18/917,264

(22) Filed: Oct. 16, 2024

(65) Prior Publication Data

US 2026/0106550 A1 Apr. 16, 2026

(51) Int. Cl.

| | |
|---|---|
| ***H02M 1/40*** | (2007.01) |
| ***G01R 22/06*** | (2006.01) |
| ***H02M 1/36*** | (2007.01) |
| ***H02M 3/335*** | (2006.01) |

(52) U.S. Cl.

CPC ...... *H02M 3/33507* (2013.01); *G01R 22/066* (2013.01); *H02M 1/36* (2013.01); *H02M 1/40* (2013.01)

(58) Field of Classification Search

None

See application file for complete search history.

(56) References Cited

U.S. PATENT DOCUMENTS

| | | | |
|---|---|---|---|
| 11,674,987 | B1 * | 6/2023 | Yu |
| 12,411,157 | B2 * | 9/2025 | Polivka |
| 2013/0265805 | A1 * | 10/2013 | Kamath |
| 2018/0184493 | A1 | 6/2018 | Gritti |
| 2021/0328517 | A1 | 10/2021 | Zheng |
| 2022/0216798 | A1 | 7/2022 | Liu |
| 2023/0273249 | A1 | 8/2023 | Muller |

* cited by examiner

*Primary Examiner* — Crystal L Hammond
*Assistant Examiner* — Seung Ho Choi
(74) *Attorney, Agent, or Firm* — Slater Matsil, LLP

(57) ABSTRACT

According to an embodiment, a flyback converter includes a transformer, a power switch coupled to the primary winding of the transformer, and a controller. The controller comprises a voltage-dependent current source, a reference capacitor, comparators, and logic circuitry. The controller estimates the primary inductance of the transformer based on the voltage across the reference capacitor, detects a saturation condition based on the estimated inductance and primary current, and implements a protection mechanism in response. The controller can distinguish between genuine overload conditions and potential magnetic tampering attempts. The protection mechanism may involve increasing the switching frequency. The controller may include an adjustable transconductance to set the saturation detection threshold and implement a delay before activating protection. This allows for more targeted protection against core saturation and magnetic interference while maintaining normal operation under high-load conditions.

20 Claims, 4 Drawing Sheets

DETECTING TRANSFORMER SATURATION IN SWITCHED-MODE POWER SUPPLIES

TECHNICAL FIELD

The present disclosure generally relates to power supply controllers and, in particular embodiments, to detecting transformer saturation in switched-mode power supplies.

BACKGROUND

Switched-mode power supplies (SMPS) are widely used in various electronic devices due to their high efficiency and compact size. Among the different topologies of SMPS, the flyback converter is particularly popular in low- to medium-power applications, such as battery chargers, LED drivers, and auxiliary power supplies in industrial equipment.

In flyback converters, the transformer plays a role in energy transfer and electrical isolation between the primary and secondary sides. The proper operation of the converter relies on the characteristics of the transformer, particularly its primary inductance. However, the magnetic properties of the transformer core can be affected by various factors, including temperature, operating conditions, and external magnetic fields.

One concern in flyback converter design is the potential for core saturation. When the transformer core saturates, its ability to store magnetic energy is reduced, leading to a rapid increase in primary current. If left unchecked, this can result in decreased efficiency, increased electromagnetic interference (EMI), and potential damage to the switching components.

Core saturation can become problematic in applications such as energy metering. In these scenarios, intentional magnetic tampering attempts may be made to disrupt the normal operation of the meter, potentially leading to energy theft. Magnetic tampering typically involves placing a strong external magnet near the transformer, which can prematurely saturate the core and cause the power supply to malfunction or shut down.

To address these challenges, power supply designers have traditionally employed various methods to protect against core saturation and magnetic tampering. The approaches often involve oversizing the transformer, using magnetic shielding, or implementing frequency-doubling techniques when the converter approaches overload conditions. However, the solutions can lead to increased costs, larger form factors, or suboptimal performance under normal operating conditions.

SUMMARY

Technical advantages are generally achieved by embodiments of this disclosure, which describe detecting transformer saturation in switched-mode power supplies.

A first aspect relates to a flyback converter, comprising a transformer having a primary winding and a secondary winding; a power switch coupled to the primary winding, wherein a primary current is flowing through the primary winding of the transformer; and a controller coupled to the power switch. The controller comprises a voltage-dependent current source, a reference capacitor coupled to the voltage-dependent current source, a first comparator configured to compare a voltage across the reference capacitor to a saturation threshold voltage, a second comparator configured to compare a sense voltage, representative of the primary current, to an overcurrent protection threshold voltage, and logic circuitry configured to generate a trigger signal based on outputs of the first and second comparators. The controller is configured to estimate a primary inductance of the transformer based on the voltage across the reference capacitor, detect a saturation condition based on the estimated primary inductance and the primary current, and implement a protection mechanism in response to the detected saturation condition.

A second aspect relates to a controller for a flyback converter. The controller comprises a voltage-dependent current source; a reference capacitor coupled to the voltage-dependent current source; a first comparator configured to compare a voltage across the reference capacitor to a saturation threshold voltage; a second comparator configured to compare a primary current to an overcurrent protection threshold, wherein the primary current is flowing through the primary winding of a transformer of the flyback converter; logic circuitry configured to generate a trigger signal based on outputs of the first and second comparators; and control circuitry configured to estimate a primary inductance of the transformer based on the voltage across the reference capacitor, detect a saturation condition based on the estimated primary inductance and the primary current, and implement a protection mechanism in response to the detected saturation condition.

A third aspect relates to a method for operating a flyback converter. The method comprises monitoring a primary current of a transformer; estimating a primary inductance of the transformer based on a voltage across a reference capacitor; comparing the estimated primary inductance to a saturation threshold; comparing the primary current to an overcurrent protection threshold; detecting a saturation condition based on the comparisons of the estimated primary inductance and the primary current; and implementing a protection mechanism in response to the detected saturation condition.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
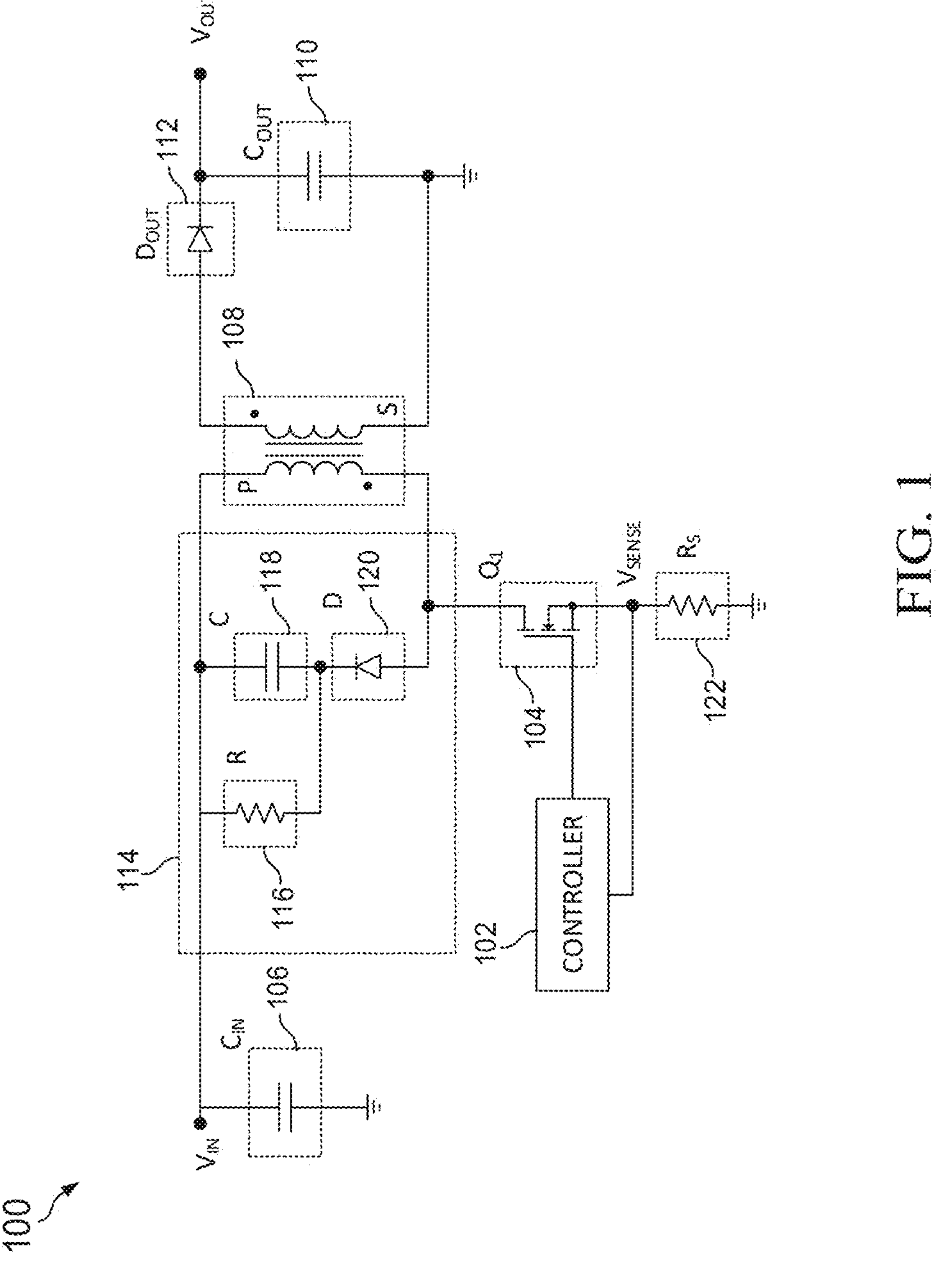
FIG. 1 is a simplified schematic of a flyback converter.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of flyback converters operating in quasi-resonant (QR) or discontinuous conduction mode (DCM), it should also be appreciated that these inventive aspects may also apply to other switched-mode power supply topologies. In particular, aspects of this disclosure may similarly apply to forward converters, push-pull converters, and other isolated DC-DC converter topologies where transformer saturation detection is advantageous for reliable operation.

In embodiments, techniques are disclosed for estimating inductance and detecting saturation in switched-mode power supplies, particularly in flyback converters operating in quasi-resonant (QR) or discontinuous conduction mode (DCM). The disclosed techniques can distinguish between genuine overload conditions and potential magnetic tampering attempts, allowing for more targeted protection strategies.

In aspects of the disclosure, a capacitor is charged during the power switch's on-time with a current proportional to the input voltage. The voltage across the capacitor at the end of the ON-time can be used to estimate the transformer's primary inductance. By comparing the voltage across the capacitor to a predetermined threshold, the system can detect if the inductance has decreased below a certain level, which may indicate core saturation.

In embodiments, the disclosed method can utilize the auxiliary winding of the flyback converter to generate a current proportional to the input voltage, eliminating the need for direct high-voltage sensing. The approach can simplify implementation and improve safety in high-voltage applications.

Embodiments of the disclosure may include a saturation trigger circuit that compares the estimated inductance with a threshold value. When the estimated inductance falls below the threshold, and the primary current approaches the cycle-by-cycle current limit, the system can activate protective measures. The measures may include increasing the switching frequency, reducing the maximum duty cycle, initiating a controlled shutdown of the converter, or a combination thereof.

The disclosed techniques can offer advantages over traditional saturation protection methods. By providing more accurate detection of core saturation, the system can avoid unnecessary interventions during normal operation while offering robust protection against magnetic tampering attempts.

Embodiments of the disclosure address a vulnerability in energy metering systems where magnetic tampering is a concern. The positioning of a strong magnet near the transformer of a power supply is a common method used to tamper with energy meters to steal energy. The tampering can force the converter to activate overload conditions, potentially causing the meter to shut down. While existing protections may activate when the power supply approaches its power limitation, these often cannot distinguish between a genuine overload and a magnetic attack.

In contrast, the techniques described in the present disclosure can provide a solution to differentiate between these scenarios. By estimating the actual inductance of the transformer, the system can determine whether an approaching power limitation is due to a real overload condition or a result of magnetic tampering. The capability allows for more targeted and effective protection strategies, potentially reducing energy theft while maintaining normal operation under genuine high-load conditions.

Aspects of the disclosure may also include methods for setting and adjusting the saturation detection threshold based on system parameters and operating conditions. The flexibility can allow the protection scheme to be tailored to specific application requirements and transformer characteristics. These and other details are further provided below.

FIG. 1 illustrates a simplified schematic of a flyback converter 100. Flyback converter 100 includes a controller 102, a power switch ($Q_1$) 104, an input capacitor ($C_{IN}$) 106, a transformer 108, an output capacitor ($C_{OUT}$) 110, an output diode ($D_{OUT}$) 112, an RCD clamp 114, and a sense resistor ($R_S$) 122, which may (or may not) be arranged as shown. RCD clamp 114 includes a resistor (R) 116, a capacitor (C) 118, and a diode (D) 120. Flyback converter 100 may include additional components not shown, such as a load at the output.

Controller 102 dictates the operation of the flyback converter 100. Controller 102 generates the necessary control signals, typically pulse-width modulation (PWM), to regulate the output voltage ($V_{OUT}$) or current. Controller 102 monitors the output and adjusts the switching frequency or duty cycle to maintain a steady output under varying load and input conditions.

The power switch ($Q_1$) 104, often a metal-oxide-semiconductor field-effect transistor (MOSFET), is the main switching element of the flyback converter 100. Controller 102 drives the power switch ($Q_1$) 104, turning it ON and OFF at a specific frequency and duty cycle. When the power switch ($Q_1$) 104 is turned ON, energy is stored in the primary winding (P) of the transformer 108. When the power switch ($Q_1$) 104 is turned OFF, the stored energy is transferred to the secondary winding (S) of the transformer 108 and then to the output.

The sense resistor ($R_S$) 122 is placed in series with the power switch ($Q_1$) 104 to monitor the current flowing through the primary winding when the power switch ($Q_1$) 104 is enabled. The voltage ($V_{SENSE}$) across the sense resistor ($R_S$) 122 is fed to the controller 102, which uses this information as a feedback signal to operate the power switch ($Q_1$) 104.

In embodiments, the flyback converter 100 can operate in two distinct modes: quasi-resonant (QR) mode and discontinuous conduction mode (DCM). Each mode offers specific advantages in terms of efficiency and electromagnetic interference (EMI) reduction, and controller 102 can be configured to switch between these modes based on load conditions and design requirements.

In DCM operation, the power switch ($Q_1$) 104 is turned on when the current in the primary winding 204 has fallen to zero and all the energy stored in the transformer 108 has been transferred to the secondary side. This ensures that no current flows in the primary winding at the beginning of each switching cycle. Controller 102 typically uses a fixed switching frequency in DCM, adjusting the duty cycle to regulate the output voltage.

QR mode builds upon DCM operation but takes advantage of the natural resonance between the primary inductance of the transformer 108 and the parasitic capacitances in the circuit, including the output capacitance of the power switch ($Q_1$) 104. After the energy transfer to the secondary side is complete and the secondary current has fallen to zero, the voltage across the power switch ($Q_1$) 104 oscillates due to this resonance.

In QR operation, controller 102 monitors the voltage across the power switch ($Q_1$) 104 and waits for the oscillating voltage to reach its minimum before turning on the power switch ($Q_1$) 104. This technique, called valley switching, reduces switching losses and EMI compared to traditional fixed-frequency DCM operation.

Depending on the load conditions, the flyback converter 100 can dynamically switch between QR and DCM modes. QR operation can be maintained at higher loads, taking advantage of its higher efficiency. As the load decreases, the time between switching cycles in QR mode would naturally increase. Controller 102 may switch to DCM with a higher fixed switching frequency at light loads to maintain good regulation and transient response.

The input capacitor ($C_{IN}$) 106 smooths the input voltage and provides a local energy reservoir for the high-frequency switching currents. This helps reduce electromagnetic interference (EMI) and improve the converter's overall efficiency.

The transformer 108 provides electrical isolation between the input voltage ($V_{IN}$) and the output voltage ($V_{OUT}$). It also stores energy during the ON state of the power switch ($Q_1$) 104 (in its primary winding) and releases it to the load of the flyback converter 100 during the OFF state of the low-side switch ($Q_1$) 104 (i.e., through its secondary winding).

The output capacitor ($C_{OUT}$) 110 is located after the second winding of the transformer 108. It filters out the high-frequency switching ripple, ensuring a stable and smooth DC output voltage ($V_{OUT}$). Storing energy also provides instantaneous power to the load during transient conditions.

The output diode ($D_{OUT}$) 112 allows current to flow from the secondary winding of the transformer 108 to the output during the OFF phase of the power switch ($Q_1$) 104 and blocks current during the ON phase, ensuring unidirectional current flow at the output.

The RCD clamp 114, or the Resistor-Capacitor-Diode clamp, is a protective circuitry used to manage voltage spikes that can occur due to the leakage inductance of the transformer 108. The resistor (R) 116 aids in dissipating energy, the capacitor (C) 118 absorbs voltage spikes, and the diode (D) 120 provides a path for the leakage energy to return, ensuring that voltage spikes do not exceed safe levels and thereby protecting the power switch ($Q_1$) 104.

Operationally, the flyback converter 100 switches the power switch ($Q_1$) 104 ON and OFF in a controlled manner. When the power switch ($Q_1$) 104 is in the ON state, energy is stored in the primary winding of the transformer 108. When the power switch ($Q_1$) 104 is in the OFF state, the stored energy is transferred to the secondary winding of the transformer 108, which is rectified, filtered, and supplied to a load at the output of the flyback converter 100.

Controller 102 constantly adjusts the operation of the flyback converter 100 based on feedback from the output to ensure that the desired output voltage ($V_{OUT}$) or current is maintained. The RCD clamp 114 ensures that any potential voltage spikes are managed and do not harm the converter's components.

Transformer 108 provides electrical isolation between the primary and secondary sides. It allows for voltage step-up or step-down depending on the ratio between the turns of the primary winding and the secondary winding.

When current flows through the primary inductance (i.e., the inductance measured across the primary winding) of the transformer 108, the magnetic flux density (B) increases proportionally to the magnetic field (H), according to the equation: B=μH, where $\mu=\mu_0\mu_r$ is the core material permeability.

The properties of ferrite magnetic materials used in the cores of the transformer 108 impose limitations on this relationship. The magnetic flux density (B) cannot increase indefinitely, and there is a limit to the magnetic field (H) beyond which the magnetic flux density (B) no longer increases. This phenomenon is called saturation magnetization, and the flux density at this state is referred to as the saturation flux density ($B_{SAT}$).

As the core approaches saturation, the rate of change of the magnetic flux density concerning the magnetic field $$\left(\text{i.e., } \frac{dB}{dH}\right)$$

decreases. When the core fully saturates, incremental change in magnetic flux density at saturation ($dB_{SAT}$) approaches zero, causing the primary inductance to behave almost like a short circuit. The behavior can be expressed as $$v_L(t) = nA_e\frac{dB_{SAT}}{dt} \cong 0,$$

where $v_L(t)$ Is the voltage across the primary winding, n is the number of turns of the primary winding, $A_c$ is the effective cross-sectional area of the core of the primary winding, and t is time. It's important to note that a small residual inductance remains due to the nonzero saturated permeability of the core material, preventing the primary winding from becoming a perfect short circuit.

The saturation effect has implications for the operation of the flyback converter 100, as it can limit the amount of energy stored in the magnetic field and lead to rapid increases in current if not properly managed. In particular, due to the saturation of the core, the primary inductance is rapidly reduced. The energy ($E_L$) stored in the primary winding 104 is reduced for a given inductor current ($I_L$), where the energy is provided by the equation, $$E_L = \frac{1}{2}LI_L^2,$$

and L is the inductance of the primary winding.

The saturation flux density ($B_{SAT}$) value can be reduced if a strong magnet is placed near the magnetic core. As a result, the inductive current required to saturate the core is also reduced, which forms the basis for potential magnetic tampering in power supply systems. Placing a strong magnet close to the transformer is often enough to induce core saturation of the transformer used in the power supply stage. Consequently, the power that the converter delivers to the output is reduced, and the meter may shut down due to the activation of the overload protection. The vulnerability creates an opportunity for energy theft through magnetic tampering.

The economic impact of such tampering can be substantial. Each year, utility providers lose a significant amount of money from energy theft, which is often caused by magnetic tampering that leads to the malfunction of the power supply stage of the meters. The widespread issue necessitates robust countermeasures to protect the utility providers and the integrity of the energy distribution system. To address this challenge, silicon suppliers can implement specific functions to protect power supplies against core saturation, thus preventing malfunctions in the event of tampering attacks.

Several solutions have been developed to address the problems of core saturation and magnetic interference in power converters. One approach involves protecting transformer 108 from external magnetic interference by using a metal shield. The magnetic shield can decrease the transformer's susceptibility to external magnetic fields, thereby reducing the likelihood of premature core saturation.

Another approach involves guaranteeing sufficient residual inductance even in cases of saturation by oversizing the primary inductance value of the transformer 108. The approach can ensure that the converter maintains sufficient residual inductance, therefore enough power capability, even when the core begins to saturate.

Yet another approach includes implementing frequency doubling functions. For example, the switching frequency doubles when the converter approaches an overload condition. This allows the converter to handle up to a 50% decrease in transformer inductance caused by external magnetizing interference.

While these solutions can provide some protection against core saturation and magnetic interference, they also come with certain drawbacks. Using a metal shield or oversizing the primary inductance can increase the cost of the magnetic component, potentially making the overall converter more expensive to produce.

Further, the conventional approaches may cause the converter to operate under non-optimized conditions. For instance, an oversized primary inductance may increase losses during normal operation when the extra inductance is unnecessary.

In the case of frequency doubling techniques, the switching frequency increases not only during magnetic interference events but also during genuine overload conditions. As a result, the converter may need to be designed with a much higher over-power protection (OPP) limit. This can necessitate electrical and thermal oversizing of the converter components, leading to increased cost and size of the overall system.

Additionally, the frequency doubling approach may not distinguish between actual overload conditions and those caused by magnetic interference, potentially leading to unnecessary increases in switching frequency and associated losses in situations where such an increase is not beneficial or necessary.

Figure 2:
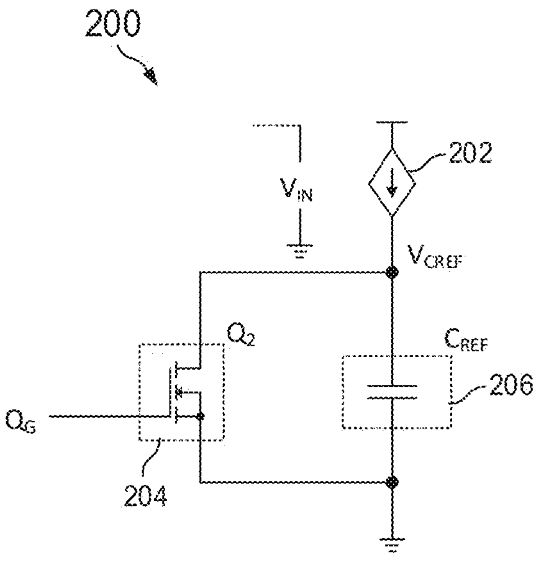
FIG. 2 is a schematic of an embodiment controller for monitoring the primary inductance of a transformer.

FIG. 2 illustrates a schematic of an embodiment controller 200 to monitor the primary inductance of a transformer. The controller 200 may be implemented as the controller 102 in FIG. 1. Controller 200 includes a voltage-dependent current source 202, a switch ($Q_2$) 204, and a capacitor ($C_{REF}$) 206, which may (or may not) be arranged as shown. Controller 200 may include additional components not shown.

During the ON-time of the power switch ($Q_1$) 104, the capacitor ($C_{REF}$) 206 is charged by the voltage-dependent current source 202. The charging process of the capacitor ($C_{REF}$) 206 is directly related to the input voltage ($V_{IN}$) and the transconductance ($g_m$) of the voltage-dependent current source 202. As the ON-time progresses, the voltage ($V_{CREF}$) across the capacitor ($C_{REF}$) 206 increases.

After the ON-time period, when the power switch ($Q_1$) 104 is turned off, the voltage ($V_{CREF}$) across the capacitor ($C_{REF}$) 206 reaches its peak value. The peak value is a function of the charging current (determined by the transconductance and the input voltage), the duration of the ON-time, and the capacitance of the capacitor ($C_{REF}$) 206. The relationship can be expressed as:

$$V_{CREF} = \frac{g_m \times V_{IN} \times T_{ON}}{C_{REF}},$$

where $V_{CREF}$ is the voltage across the capacitor ($C_{REF}$) 206 at the end of the ON-time, $g_m$ is the transconductance of the voltage-dependent current source 202, $V_{IN}$ is the input voltage, $T_{ON}$ is the duration of the ON-time, and $C_{REF}$ is the capacitance of the capacitor ($C_{REF}$) 206.

During DCM or QR mode, the ON-time of the power switch ($Q_1$) 104, the peak primary current ($I_P$), the primary inductance ($L_M$), and the input voltage ($V_{IN}$) are interrelated based on the equation:

$$T_{ON} = \frac{\hat{I}_p \times L_M}{V_{IN}}.$$

By combining this equation with the previously established relationship for the voltage ($V_{CREF}$) across the capacitor ($C_{REF}$) 206, a new equation can be established relating the voltage ($V_{CREF}$) across the capacitor ($C_{REF}$) 206 directly to the primary inductance ($L_M$):

$$V_{CREF} = \frac{g_m}{C_{REF}} \times \hat{I}_p \times L_M.$$

The derived equation reveals insight into the behavior of the flyback converter. It demonstrates that the voltage ($V_{CREF}$) across the capacitor ($C_{REF}$) 206 is directly proportional to the primary inductance ($L_M$), given that the peak primary current ($I_P$) is known. The proportionality constant is determined by the ratio of the transconductance ($g_m$) to the capacitance of the capacitor ($C_{REF}$) 206.

Notably, the relationship between the voltage ($V_{CREF}$) across the capacitor ($C_{REF}$) 206 and the primary inductance ($L_M$) is independent of the converter's operating conditions, such as input voltage and switching frequency. The independence makes the voltage ($V_{CREF}$) across the capacitor ($C_{REF}$) 206 an ideal parameter for monitoring the primary inductance and, by extension, detecting core saturation, regardless of variations in input voltage or changes in switching frequency that may occur during normal operation or under different load conditions.

Accordingly, the voltage ($V_{CREF}$) across the capacitor ($C_{REF}$) 206 provides information about the primary inductance of the transformer 108 and enables the controller 200 to identify potential core saturation or tampering attempts.

The switch ($Q_2$) 204 resets the capacitor ($C_{REF}$) 206 by discharging it at the beginning of each switching cycle. The reset operation ensures accurate measurement of the primary inductance in each cycle. In particular, when the switch ($Q_2$) 204 is closed, it provides a low-impedance path to ground for the capacitor ($C_{REF}$) 206, rapidly discharging any voltage accumulated from the previous cycle. The action prepares capacitor ($C_{REF}$) 206 for a new charging cycle, allowing it to start from a known state (fully discharged) at the beginning of each ON-time of the power switch ($Q_1$) 104.

The switch ($Q_2$) 204 is in a closed position for the entire ON-time of the power switch ($Q_1$) 104, allowing capacitor ($C_{REF}$) 206 to charge during this period. The switch ($Q_2$) 204 is then turned OFF at some point between the end of the current ON-time and the beginning of the next ON-time. This ensures that at the start of each new ON-time cycle, the capacitor ($C_{REF}$) 206 is fully discharged. This allows the capacitor ($C_{REF}$) 206 to begin each ON-time cycle in a discharged state, ready to accumulate charge during the next ON-time of the power switch ($Q_1$) 104.

The cyclic reset-and-charge operation of the capacitor ($C_{REF}$) 206, facilitated by the switch ($Q_2$) 204, ensures that the voltage ($V_{CREF}$) across the capacitor ($C_{REF}$) 206 accurately reflects the current cycle's primary inductance, unaffected by residual charge from previous cycles.

Figure 3:
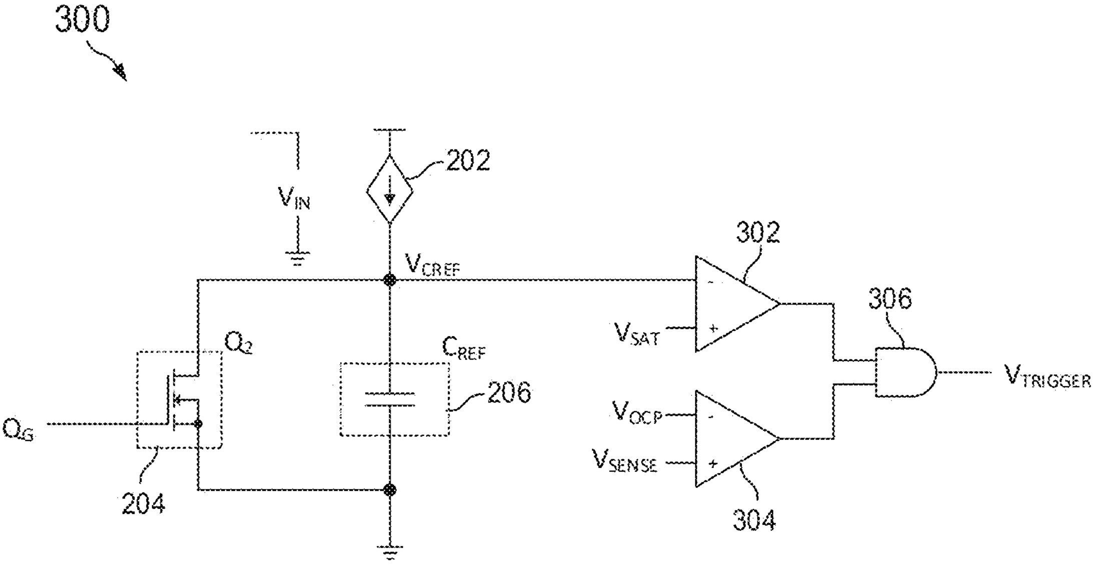
FIG. 3 is a schematic of an embodiment controller.

FIG. 3 illustrates a schematic of an embodiment controller 300, which may be implemented as the controller 102 in FIG. 1. Controller 300 is configured to detect and respond to transformer saturation conditions.

Controller 300 includes the voltage-dependent current source 202, the switch ($Q_2$) 204, the capacitor ($C_{REF}$) 206, a first comparator 302, a second comparator 304, and an optional AND gate 306, which may (or may not) be arranged as shown. Controller 200 may include additional components not shown.

As previously described in the discussion of the controller 200, the voltage-dependent current source 202, the switch ($Q_2$) 204, and the capacitor ($C_{REF}$) 206 form a part of the saturation detection mechanism. These components work in concert to generate and measure the voltage ($V_{CREF}$) across the capacitor ($C_{REF}$) 206, which is proportional to the primary inductance of the transformer 108. For the sake of brevity, the detailed operation of these components will not be reiterated here, as their functions remain consistent with the earlier explanation. Instead, this description will focus on the additional components and their roles in the overall saturation detection and protection scheme of the controller 300.

Controller 300 employs two comparators for its decision-making process. The first comparator 302 compares the voltage ($V_{CREF}$) across the capacitor ($C_{REF}$) 206 with a predefined saturation threshold voltage ($V_{SAT}$). The comparison result indicates whether the inductance of transformer 108 has decreased to a level indicative of core saturation.

In the context of transformer saturation, it is useful to introduce the concept of an equivalent inductance ($L_{SAT}$). The equivalent inductance ($L_{SAT}$) can be defined as a constant-value inductor that stores the same energy per switching cycle as an inductor operating under saturation conditions. In a saturated conductor, the actual inductance value varies depending on the current flowing through it. The equivalent inductance ($L_{SAT}$) provides a simplified model that maintains energy equivalence using a fixed inductance value.

In embodiments, the saturation current ($I_{SAT}$) provides a safety margin concerning the converter's current limitation threshold. For example, the saturation current ($I_{SAT}$) can be set to be a percentage of the maximum allowable drain current ($I_{DLIM}$) of the power switch ($Q_1$) 104. The deliberate setting ensures the saturation detection mechanism can trigger before the converter reaches its absolute current limit.

By defining the equivalent inductance ($L_{SAT}$) and the saturation current ($I_{SAT}$), the control system can effectively monitor for saturation conditions while maintaining a buffer zone before reaching critical current levels. The approach allows for more nuanced and preemptive protection strategies. It enables the converter to respond to potential saturation events before they lead to a complete loss of regulation or trigger hard current limit protections.

It's important to note that the equation relating voltage ($V_{CREF}$) across the capacitor ($C_{REF}$) 206 to the primary inductance ($L_M$) assumes that the primary inductance ($L_M$) remains constant. However, during a saturation event, the value of the primary inductance ($L_M$) is not constant but changes as a function of the current passing through it. In other words, primary inductance ($L_M$) becomes the variable primary inductance ($L_M(i)$), where i represents the current.

To simplify calculations in the context of a flyback converter that transfers energy in each switching cycle, it is convenient to introduce the concept of an equivalent inductance ($L_{SAT}$). As defined earlier, the equivalent inductance ($L_{SAT}$) is not a real inductance but a mathematical construct. It represents a constant-value inductor that stores the same energy per switching cycle as the actual variable primary inductance ($L_M(i)$) under saturation conditions.

The use of the equivalent inductance ($L_{SAT}$) allows for more straightforward energy calculations and behavior modeling of the transformer 108 under saturation conditions. Using this equivalent constant inductance, energy equivalence can be maintained while simplifying the equations used in subsequent calculations. This approach can be particularly useful when analyzing the converter's operation at the point where the peak current reaches the saturation current ($I_{SAT}$).

For the Variable Inductance Case:

$$E_{ON} = \int_0^{I_{SAT}} L_M(i) \times i \times di.$$

For the Equivalent Constant Inductance Case:

$$E_{ON} = \frac{1}{2} \times L_{SAT} \times I_{SAT}^2.$$

By equating the two expressions of stored energy, a formula for the equivalent inductance ($L_{SAT}$) can be derived:

$$L_{SAT} = \frac{2}{I_{SAT}^2} \int_0^{I_{SAT}} L_M(i) \times i \times di.$$

The equation allows one to calculate the equivalent inductance ($L_{SAT}$) based on the behavior of the variable primary inductance ($L_M(i)$) as it approaches saturation. The equivalent inductance ($L_{SAT}$) can accurately represent the transformer's behavior under saturation conditions, enabling more effective detection and response to potential core saturation or tampering attempts.

The second comparator 304 compares the primary current ($I_P$) through the sense voltage ($V_{SENSE}$) across the sense resistor ($R_S$) 122 with an overcurrent protection threshold voltage ($V_{OCP}$), ensuring that the primary current remains within safe limits. In embodiments, the overcurrent protection threshold voltage ($V_{OCP}$) is set to be less than or equal to the product of the resistance ($R_{SENSE}$) of the sense resistor ($R_S$) 122 and the maximum allowable drain current ($I_{DLIM}$) of the power switch ($Q_1$) 104 (i.e., $V_{OCP} \leq R_{SENSE} \times I_{DLIM}$).

After each ON-time period of the power switch ($Q_1$) 104, controller 300 evaluates the outputs of the first comparator 302 and the second comparator 304 to determine if a potential saturation condition exists. Specifically, the controller 300 checks if the voltage ($V_{CREF}$) across the capacitor ($C_{REF}$) 206 has fallen below the predefined saturation threshold voltage ($V_{SAT}$) and if the sense voltage ($V_{SENSE}$) across the sense resistor ($R_S$) 122 has risen to meet or exceed the overcurrent protection threshold voltage ($V_{OCP}$). When both conditions are met simultaneously, a response from the controller 300 is triggered.

The simultaneous occurrence of these conditions (i.e., $V_{CREF}<V_{SAT}$ and $V_{OCP}\leq R_{SENSE}\times I_{DLIM}$) leads controller 300 to assume that the current primary inductance ($L_M$) has decreased below the defined equivalent saturation inductance ($L_{SAT}$).

Accordingly, in embodiments, the protection circuit employs two comparators that work in tandem to ensure optimal and safe transformer operation. The first comparator 302 detects core saturation by identifying when the inductance falls below a predetermined, selectable threshold. This detection prevents excessive current flow and potential damage to the transformer. Concurrently, the second comparator 304 monitors whether the inductance value, even during saturation conditions, remains sufficient to support the current output load requirements. The synergy between the two comparators allows the protection mechanism by the circuit to trigger the protective measures in response to both conditions being met: the inductance has dropped to a level indicating core saturation (as detected by the first comparator 302), and this reduced inductance is inadequate to maintain proper output voltage regulation for the given load (as determined by the second comparator 304). The dual-check system ensures that the protection is activated precisely when needed, balancing core damage prevention with consistent power output maintenance.

In embodiments, controller 300 initiates protective measures (i.e., counteractions) or signals an alert upon detecting this condition. One such counteraction may involve increasing the converter's switching frequency. The increased switching frequency can help mitigate the effects of the reduced inductance by allowing less time for the current to build up in each cycle, potentially preventing further saturation and maintaining better control over the power transfer.

It's important to note that increasing the switching frequency is just one possible response. Depending on the specific design and requirements of the power supply system, controller 300 may employ other strategies or a combination of approaches, such as increasing the drain current ($I_{DLIM}$) of the power switch ($Q_1$) 104 or a combination of increasing the switching frequency and the increasing of the drain current ($I_{DLIM}$) of the power switch ($Q_1$) 104. The counteractions are designed to maintain the converter's safe operation and protect it from potential damage or malfunction due to core saturation or tampering attempts.

In embodiments, controller 300 allows for flexible adjustment of the protection threshold through the transconductance ($g_m$) of the voltage-dependent current source 202. The flexibility enables the controller 300 to maintain consistent protection levels across various operating conditions. The relationship between the transconductance ($g_m$) of the voltage-dependent current source 202 and the saturation parameters can be derived from the equation $$V_{CREF} = \frac{g_m \times V_{IN} \times T_{ON}}{C_{REF}}.$$

From this equation, the transconductance ($g_m$) of the voltage-dependent current source 202 can be represented as:

$$g_m = \frac{T_{SAT}}{L_{SAT}},$$

where $T_{SAT}$ is a time constant defined as $$T_{SAT} = C_{REF} \times R_{SENSE} \times \frac{V_{SAT}}{V_{OCP}}.$$

In embodiments, the time constant ($T_{SAT}$) comprises known system parameters determined during the design phase. It can incorporate the capacitance ($C_{REF}$), the current sense resistance ($R_{SENSE}$), and the ratio of the saturation voltage threshold ($V_{SAT}$) to the overcurrent protection threshold voltage ($V_{OCP}$).

The significance of this formulation lies in its independence from variable operating conditions such as the input voltage ($V_{IN}$) and the switching frequency ($F_{SW}$). Once the transconductance ($g_m$) of the voltage-dependent current source 202 is set based on these a priori known system parameters, the intervention point of the protection mechanism becomes ideally independent of fluctuating operational factors. The approach ensures that the saturation detection and protection functions consistently across a wide range of input voltages and load conditions, providing robust and reliable operation in various applications.

In embodiments, the result of each of the first comparator 302 and the second comparator 304 is fed to the AND gate 306. The AND gate 306 provides a trigger signal ($V_{TRIGGER}$) when the first comparator 302 and the second comparator 308 indicate that the voltage ($V_{CREF}$) across the capacitor ($C_{REF}$) 206 has fallen below the predefined saturation threshold voltage ($V_{SAT}$) and if the sense voltage ($V_{SENSE}$) across the sense resistor ($R_S$) 122 has risen to meet or exceed the overcurrent protection threshold voltage ($V_{OCP}$). The trigger signal ($V_{TRIGGER}$) can initiate various protection mechanisms, such as frequency doubling, duty cycle reduction, or controlled shutdown, implemented by the drive signal provided by controller 300 to the power switch ($Q_1$) 104.

In embodiments, while an AND gate 306 is described for combining the outputs of the first comparator 302 and the second comparator 304, it should be understood that other logic circuits or combinations thereof can be used to process these outputs.

For example, the system could implement separate logic paths to individually signal when the first comparator 302 detects an inductance below the threshold, when the second comparator 304 detects a current exceeding the overcurrent protection threshold, and when both conditions occur simultaneously. This could be achieved using a combination of logic gates, such as OR gates, NAND gates, or more complex programmable logic devices.

Such implementations would allow the system to distinguish between different events (e.g., low inductance only, overcurrent only, or both) and potentially trigger different responses based on the specific condition detected. The flexibility in logic implementation enables more nuanced detection and response strategies, potentially improving the system's ability to differentiate between genuine overload conditions and magnetic tampering attempts.

In embodiments, when the converter approaches its maximum output power capability, it enters a state known as output power limitation (OLP). This state is typically triggered in conventional systems when the primary current reaches a predetermined threshold, regardless of the underlying cause. However, controller 300 can go beyond the simple current-based detection by incorporating inductance estimation into the decision-making process.

In embodiments, controller 300 incorporates a mechanism to distinguish between genuine overload conditions and potential tampering attempts, particularly when the flyback converter enters output power limitation (OLP protection) mode. The differentiation allows for maintaining the integrity and reliability of the power supply, especially in applications such as energy metering, where tampering is a significant concern.

In a genuine overload condition, the primary current increases, but the inductance of transformer 108 remains relatively stable. Conversely, during a tampering attempt involving magnetic interference, the primary current increases, and the effective inductance of transformer 108 decreases due to core saturation.

For example, if the result of the comparison at the output of the second comparator 304 indicates that the current at the primary winding of transformer 108 has reached its limit but the result of the comparison at the output of the first comparator 302 indicates that the estimated inductance is within the normal range, the controller 200 provides a trigger signal ($V_{TRIGGER}$) indicating a genuine overload condition.

On the other hand, if the result of the comparison at the output of the second comparator 304 indicates that the current at the primary winding of transformer 108 has reached its limit and simultaneously the comparison at the output of the first comparator 302 indicates that the estimated inductance is significantly decreased, the controller 300 provides a trigger signal ($V_{TRIGGER}$) indicating a potential tampering attempt. This scenario indicates core saturation likely caused by external magnetic interference, a common method used in energy theft attempts.

By continuously monitoring the primary current and the estimated inductance, controller 300 can differentiate between normal high-load conditions and core saturation events, potentially caused by magnetic tampering. This allows for more targeted and effective protection strategies, enhancing the reliability of the power supply in critical applications such as energy metering.

Further, continuous monitoring and analysis of the parameters over time enhance the ability to distinguish between these conditions. Sudden changes in inductance coinciding with output power limitation events are more likely to indicate tampering, while gradual changes leading to output power limitation may suggest legitimate load increases or other non-malicious factors affecting the converter's operation.

By employing the dual-parameter approach—monitoring current and inductance—the controller 300 achieves a higher degree of accuracy in identifying the true nature of output power limitation events. The advanced discrimination capability allows for more appropriate and targeted responses to different scenarios, enhancing the security and reliability of the power supply system.

Primary inductance can be estimated for saturation detection in both QR and DCM modes. The voltage ($V_{CREF}$) across the capacitor ($C_{REF}$) 206, which is proportional to the primary inductance, can be measured at the end of each ON-time of the power switch ($Q_1$) 104. This allows the saturation detection mechanism to function effectively regardless of whether the converter operates in QR or DCM mode.

In embodiments, the configuration allows controller 300 to maintain output voltage regulation even when transformer 108 begins to saturate, as long as the primary cycle-by-cycle current limitation ($I_P$) remains below the drain current limitation threshold ($I_{DLIM}$). This behavior is consistent regardless of input voltage fluctuations or changes in operation mode between Continuous Conduction Mode (CCM) and Discontinuous Conduction Mode (DCM).

By continuously monitoring both the primary current and the estimated inductance, controller 300 can effectively distinguish between normal high-load conditions and potentially harmful saturation events, including those that might be caused by intentional external disturbances. The capability enables the controller to implement targeted protection strategies, enhancing the overall reliability and security of the power supply system.

In embodiments, the system incorporates a mechanism for adjusting the threshold at which saturation is detected, providing flexibility to adapt to different operating conditions and transformer characteristics. The adjustability can be achieved by modifying the transconductance ($g_m$) of the voltage-dependent current source 202.

By altering the transconductance, the system can effectively change the relationship between the measured voltage across the capacitor ($C_{REF}$) 206 and the estimated primary inductance. The adjustment allows fine-tuning the saturation detection sensitivity without modifying other hardware components.

The threshold adjustment can be based on a set of known system parameters, including the capacitor ($C_{REF}$) 206, the sense resistor ($R_S$) 122, and the ratio of the saturation threshold voltage ($V_{SAT}$) to the overcurrent protection threshold voltage ($V_{OCP}$). These parameters can be combined to form a time constant ($T_{SAT}$) that relates the transconductance to the saturation inductance threshold ($L_{SAT}$).

By modifying the transconductance, the system designer can set the desired saturation inductance threshold ($L_{SAT}$) at which the protection mechanism will be triggered. The adjustability ensures that the saturation detection remains effective across a wide range of input voltages and load conditions, maintaining consistent protection levels throughout the converter's operating range.

Further, this adaptable threshold allows the system to be optimized for different transformer designs and application requirements. For example, in applications where a higher tolerance for inductance variation is acceptable, the threshold can be set lower, reducing the likelihood of false triggers. Conversely, in applications requiring stricter control over inductance variations, the threshold can be higher for more sensitive detection.

The threshold adjustment capability enhances the protection system's versatility, making it suitable for various switched-mode power supply designs and applications. It provides designers with a powerful tool to balance robust protection and operational flexibility, tailoring the system's response to the specific needs of each implementation.

In embodiments, an optional delay mechanism can be implemented between detecting a saturation condition and triggering protective measures. The delay can enhance the system's robustness against transient conditions that might trigger unnecessary protective actions.

The delay mechanism can operate by introducing a time interval between the moment when both comparators indicate a potential saturation condition and the actual activation of the protection scheme. During the delay period, the system can continue to monitor the outputs of both comparators. In embodiments, if the condition persists throughout the delay period, the system only triggers protective measures, such as increasing the switching frequency or reducing the maximum duty cycle.

In embodiments, the delay duration can be adjusted based on the application's specific requirements. A longer delay might be suitable for systems that experience frequent, short-lived transients. A shorter delay could be appropriate for applications where rapid response to potential threats is crucial.

It's important to note that while this delay mechanism adds an extra layer of protection against false triggers, it is not essential. The system can still function effectively by immediately triggering protective measures upon detecting a saturation condition. The delay can be an optional feature implemented or omitted based on the application's specific needs.

The optional delay mechanism can further enhance the protection system's flexibility and adaptability, allowing it to be fine-tuned for optimal performance across a wide range of operating conditions and application requirements.

Figure 4:
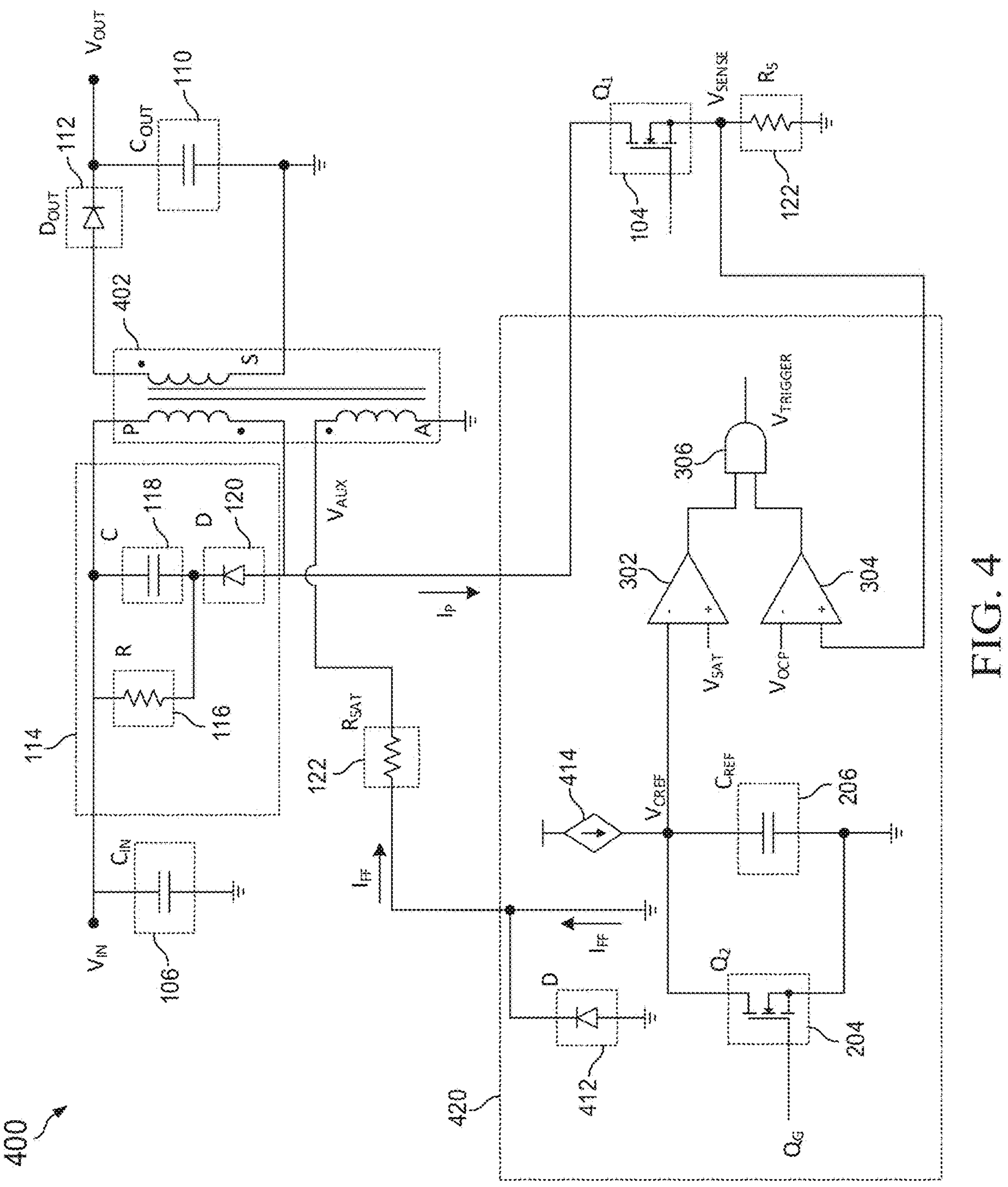
FIG. 4 is a schematic of an embodiment flyback converter with saturation detection capabilities.

FIG. 4 illustrates a schematic of an embodiment flyback converter 400 with saturation detection capabilities in accordance with aspects of the present disclosure. The flyback converter 400 includes a primary side and a secondary side, electrically isolated from each other by the transformer 402 with primary winding (P), secondary winding (S), and auxiliary winding (A), which may (or may not) be arranged as shown.

Flyback converter 400 includes a controller 420, the power switch ($Q_1$) 104, the input capacitor ($C_{IN}$) 106, the transformer 402, the output capacitor ($C_{OUT}$) 110, the output diode ($D_{OUT}$) 112, the RCD clamp 114, the sense resistor ($R_S$) 122, a resistor ($R_{SAT}$) 410, and a diode 412, which may (or may not) be arranged as shown. RCD clamp 114 includes the resistor (R) 116, the capacitor (C) 118, and the diode (D) 120. Flyback converter 400 may include additional components that are not shown, such as a load at the output.

In practical implementations, the voltage-dependent current source 202 can be realized using the auxiliary winding of the transformer 402. This approach provides a simple and effective method to generate a current proportional to the input voltage without requiring direct high-voltage sensing.

The auxiliary winding, typically already present in many flyback converter designs for control and synchronization purposes, offers a convenient means to sample the input voltage. During the ON-time of the main power switch, the voltage across the auxiliary winding is proportional to the input voltage, with the proportionality determined by the turns ratio between the auxiliary and primary windings.

The auxiliary winding of the transformer 402 is coupled to the resistor ($R_{SAT}$) 404. The combination provides a voltage proportional to the input voltage during the ON-time of the power switch ($Q_1$) 104. The voltage across the resistor ($R_{SAT}$) 404 is converted to a current ($I_{FF}$) and mirrored and scaled by the current-dependent current generator 414.

Controller 420 can implement QR mode by using the auxiliary winding to detect the valleys in the drain voltage of the power switch ($Q_1$) 104. The voltage across the auxiliary winding is proportional to the voltage across the power switch ($Q_1$) 104, allowing the controller 420 to accurately time the turn-ON events of the power switch ($Q_1$) 104.

In an embodiment, the dependence on the input voltage ($V_{IN}$) can be achieved by monitoring the auxiliary voltage ($V_{AUX}$) across the auxiliary winding. During the ON-time of the power switch ($Q_1$) 104, the auxiliary voltage ($V_{AUX}$) is proportional to the input voltage ($V_{IN}$), with the proportionality determined by the auxiliary-to-primary turns ratio. The relationship allows for replacing the voltage-dependent current source 202 with a current-dependent current generator 414 coupled to the auxiliary winding through the resistor ($R_{SAT}$) 410.

The current ($I_{FF}$) flowing through the resistor ($R_{SAT}$) 410 can be expressed as $$I_{FF} = \frac{V_{IN}}{R_{SAT}} \times \frac{N_{AUX}}{N_{PRI}},$$

where $N_{AUX}$ and $N_{PRI}$ are the number of turns in the auxiliary winding and the primary winding, respectively. The relationship leads to a modification of the original equation for the voltage ($V_{CREF}$) across the capacitor ($C_{REF}$) 206:

$$V_{CREF} = \frac{L_{SAT}}{C_{REF} \times R_{SAT}} \times \frac{N_{AUX}}{N_{PRI}} \times \hat{I}_P \times L_M.$$

Further, the equation for determining the transconductance ($g_m$) of the voltage-dependent current source 202

$$\left(\text{i.e., } g_m = \frac{T_{SAT}}{L_{SAT}}\right)$$

is adjusted to $$R_{SAT} = \frac{L_{SAT}}{T_{SAT}} \times \frac{N_{AUX}}{N_{PRI}},$$

where $T_{SAT}$ is a time constant defined as $$T_{SAT} = \frac{C_{REF} \times V_{SAT} \times R_{SENSE}}{K_0 \times V_{OCP}}.$$

The time constant ($T_{SAT}$) is composed of known system parameters, including the capacitance ($C_{REF}$), the saturation threshold voltage ($V_{SAT}$), the current sense resistance ($R_{SENSE}$), a scaling factor ($K_o$), and the overcurrent protection threshold voltage ($V_{OCP}$). By utilizing these relationships, the flyback converter 400 can maintain its effectiveness across varying input voltages while relying on parameters that are known a priori or can be precisely controlled within the design.

The current ($I_{FF}$) flowing through the resistor ($R_{SAT}$) 410 can be mirrored and scaled by the current-dependent current generator 414. The scaled current charges the capacitor ($C_{REF}$) 206, producing a voltage that is proportional to the primary inductance, as in the original concept.

The implementation allows for adjusting the saturation detection threshold by modifying the resistor ($R_{SAT}$) 410 rather than directly changing the transconductance of the voltage-dependent current source 202.

The approach offers several advantages. It eliminates the need for high-voltage sensing circuitry, improving safety and reducing complexity. It also leverages existing components in the flyback converter, minimizing additional costs. Further, it maintains the system's independence from input voltage variations, ensuring consistent protection across the converter's operating range.

Figure 5:
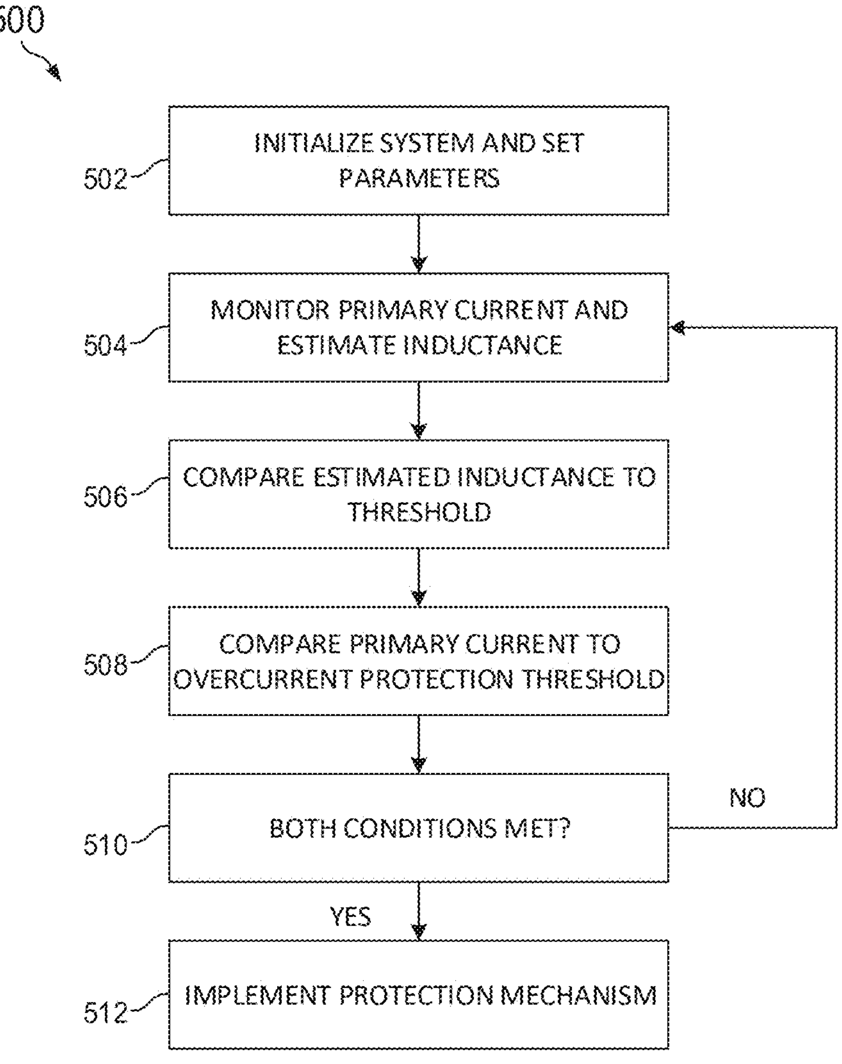
FIG. 5 is a flowchart of an embodiment method for operating a converter to detect a saturation condition and implement a protection mechanism.

FIG. 5 illustrates a flowchart of an embodiment method 500 for operating a converter to detect a saturation condition and implement a protection mechanism. It is noted that all steps outlined in the flow chart of method 500 are not necessarily required and can be optional. Further, changes to the arrangement of the steps, removal of one or more steps and path connections, and addition of steps and path connections are similarly contemplated.

At step 502, the system initializes and sets up necessary parameters, including the threshold values for inductance and current. Further, comparators, logic gates, and other circuit components can be initialized to their proper initial states, ready to begin the monitoring and protection.

In embodiments, the system sets the saturation inductance threshold ($L_{SAT}$) and overcurrent protection threshold voltage ($V_{OCP}$). The saturation inductance threshold ($L_{SAT}$) can be determined based on the known characteristics of the transformer and the desired level of sensitivity for saturation detection. The value represents the minimum acceptable inductance before the system considers the transformer to be approaching saturation.

The overcurrent protection threshold voltage ($V_{OCP}$) is set such that the equivalent current threshold ($I_{OCP}$) is set to a value below the maximum allowable drain current ($I_{DLIM}$) of the power switch, typically as a percentage of the drain current ($I_{DLIM}$). This provides a safety margin to allow the system to react before reaching critical current levels.

In embodiments, the transconductance ($g_m$) of the current source is initialized to adjust the saturation detection sensitivity. In embodiments, a capacitor is discharged to ensure it starts from a known state. The converter's switching frequency is set to its initial operating value, and any counters or timers used for the optional delay feature are reset.

If the system includes logging or alerting capabilities for potential magnetic attacks, these features can also be initialized in step 502. In embodiments, the controller may include internal registers or be coupled to an external memory to facilitate the logging of alerts and events. The registers or memory can store information such as timestamps of detected saturation events, duration of protection mechanism activation, frequency of occurrences, and specific parameter values (e.g., estimated inductance, primary current) at detection time. The logging capability lets the system maintain a historical record of potential tampering attempts or unusual operating conditions. The stored data can be valuable for post-event analysis, helping system operators identify patterns of tampering attempts, assess the effectiveness of the protection mechanisms, and potentially improve the overall security and reliability of the power supply system.

In some implementations, the controller may also include communication interfaces that allow this logged data to be transmitted to external monitoring systems for real-time or periodic analysis, further enhancing the system's capability to detect and respond to short-term threats and long-term trends in power supply operation and potential tampering attempts.

In step 504, the system monitors the transformer's primary current and estimates the primary inductance. The estimation can be performed using the voltage across a capacitor.

At step 506, the estimated inductance is compared to a predetermined threshold value. Simultaneously or independently of step 506, at step 508, the system compares the primary current to an overcurrent protection threshold.

At decision point 510, method 500 determines if both conditions are met (i.e., if the estimated inductance is below the threshold and the primary current exceeds the overcurrent protection threshold). If both conditions are not met, method 500 returns to step 504 to continue monitoring. If both conditions are met, method 500 proceeds to step 512.

At step 512, the system triggers the protection mechanism. This can involve increasing the converter's switching frequency. A brief delay may be implemented before triggering the protection mechanism to avoid responding to transient conditions. The system can continue to monitor the conditions while the protection mechanism is active. The ongoing monitoring allows the system to determine when normal operation can resume.

The system can check if the saturation condition has been resolved. This can involve reassessing the inductance and current levels against their respective thresholds. If the saturation condition persists, the system can maintain and monitor the protection mechanism. If the condition has been resolved, the system can deactivate the protection mechanism and resume the converter's normal operation.

Following the completion of step 512, regardless of whether the protection mechanism was deactivated or is still active, method 500 returns to step 504 to continue the regular monitoring cycle.

Aspects of the disclosure offer several advantages over conventional solutions in power supply protection and anti-tampering measures. One advantage is the precise activation of anti-tampering protection. The controller can trigger protective measures only when genuine saturation occurs and the inductance falls below a user-adjustable threshold. The targeted approach ensures that the protection activates solely in cases of real threat, avoiding unnecessary interventions. Notably, even if some saturation occurs, the protection can remain inactive as long as the residual inductance ($L_M$) exceeds the defined saturation threshold ($L_{SAT}$). This feature allows the converter to maintain output regulation without premature protective actions.

Further, embodiments of the disclosure enable a reduction in the size and cost of magnetic components. By more accurately detecting true saturation events, the converter eliminates the need for oversized transformers or excessive magnetic shielding that are often required in existing solutions.

Moreover, embodiments of the disclosure remove the necessity to oversize the converter to accommodate extra power capability during genuine overload conditions. Advantageously, the optimization leads to more efficient and cost-effective designs without compromising protection.

A distinguishing factor of the embodiments disclosed is the ability to differentiate between a magnetic attack attempt and a real overload condition. Unlike existing solutions that activate protection whenever the converter approaches an overload state, the dual-parameter approach considers current levels and inductance measurements regardless of inductance values. This allows for more nuanced and accurate responses, enhancing security against tampering and operational efficiency during legitimate high-load scenarios.

In embodiments, a technique for distinguishing between a genuine overload condition and a magnetic attack in a switched-mode power supply, particularly in flyback converters operating in quasi-resonant (QR) or discontinuous conduction mode (DCM), is provided. The distinction is advantageous, especially in applications such as energy metering, where magnetic tampering can be a significant concern.

In embodiments, two comparators evaluate different aspects of the converter's operation. The first comparator monitors the estimated primary inductance of the transformer, while the second comparator monitors the primary current. By analyzing the outputs of both comparators simultaneously, a genuine overload condition and a potential magnetic tampering attempt can be differentiated.

When the output of the first comparator is low (indicating normal inductance) and the output of the second comparator is high (indicating high current), a genuine overload condition is determined. In this case, the converter can respond with standard overload protection measures.

Conversely, when the output of the first comparator is high (indicating reduced inductance) and the output of the second comparator is low, a potential magnetic attack is determined. This scenario suggests that the transformer's inductance has been compromised, possibly due to external magnetic interference, but the current has not yet reached overload levels.

The ability to distinguish between these conditions allows for more targeted and effective protection strategies. In the case of a genuine overload, standard protection measures can be implemented. However, in the case of a detected magnetic attack, specific anti-tampering measures can be activated, such as increasing the switching frequency, to maintain proper operation despite the compromised inductance.

Advantageously, the distinction capability significantly enhances the reliability and security of power supplies in applications where magnetic tampering is a risk, such as in energy metering systems. It allows the power supply to respond appropriately to threats, maintaining optimal performance under normal conditions while providing robust protection against intentional interference.

In addition to triggering protective measures, the system can log or alert when a potential magnetic attack is detected. This functionality can provide valuable information for system operators and enhance the power supply's overall security.

For example, the system can generate a log entry or trigger an alert upon detecting a possible magnetic tampering attempt. The log entry may include relevant information such as the timestamp of the event, the values of key parameters at the time of detection, and the duration of the suspected attack. The logging functionality can allow for post-event analysis and help identify patterns of tampering attempts over time.

The alert mechanism can take various forms depending on the specific application requirements. It may involve sending a signal to a connected monitoring system, activating a visual or audible alarm, or transmitting a notification to a remote operator. The real-time alerting capability enables prompt investigation and response to potential security threats.

By incorporating the logging and alerting features, the system protects against immediate threats and provides valuable data for long-term security analysis and improvement. The information can be advantageous for energy providers in tracking and preventing energy theft attempts and improving the overall resilience of their metering systems against magnetic tampering.

A first aspect relates to a flyback converter, comprising a transformer having a primary winding and a secondary winding; a power switch coupled to the primary winding, wherein a primary current is flowing through the primary winding of the transformer; and a controller coupled to the power switch. The controller comprises a voltage-dependent current source, a reference capacitor coupled to the voltage-dependent current source, a first comparator configured to compare a voltage across the reference capacitor to a saturation threshold voltage, a second comparator configured to compare a sense voltage, representative of the primary current, to an overcurrent protection threshold voltage, and logic circuitry configured to generate a trigger signal based on outputs of the first and second comparators. The controller is configured to estimate a primary inductance of the transformer based on the voltage across the reference capacitor, detect a saturation condition based on the estimated primary inductance and the primary current, and implement a protection mechanism in response to the detected saturation condition.

In a first implementation form of the flyback converter, according to the first aspect as such, the transformer further comprises an auxiliary winding coupled to the voltage-dependent current source.

In a second implementation form of the flyback converter, according to the first aspect as such or any preceding implementation form of the first aspect, the flyback converter further comprises a resistor coupled between the auxiliary winding and the voltage-dependent current source.

In a third implementation form of the flyback converter, according to the first aspect as such or any preceding implementation form of the first aspect, the protection mechanism comprises increasing a switching frequency of the power switch.

In a fourth implementation form of the flyback converter, according to the first aspect as such or any preceding implementation form of the first aspect, the controller is further configured to distinguish between a genuine overload condition and a magnetic tampering attempt based on the outputs of the first and second comparators.

In a fifth implementation form of the flyback converter, according to the first aspect as such or any preceding implementation form of the first aspect, the controller is further configured to implement a delay between detecting the saturation condition and implementing the protection mechanism.

In a sixth implementation form of the flyback converter, according to the first aspect as such or any preceding implementation form of the first aspect, the controller is further configured to generate a log entry or alert upon detecting a potential magnetic tampering attempt.

A second aspect relates to a controller for a flyback converter. The controller comprises a voltage-dependent current source; a reference capacitor coupled to the voltage-dependent current source; a first comparator configured to compare a voltage across the reference capacitor to a saturation threshold voltage; a second comparator configured to compare a primary current to an overcurrent protection threshold, wherein the primary current is flowing through the primary winding of a transformer of the flyback converter; logic circuitry configured to generate a trigger signal based on outputs of the first and second comparators; and control circuitry configured to estimate a primary inductance of the transformer based on the voltage across the reference capacitor, detect a saturation condition based on the estimated primary inductance and the primary current, and implement a protection mechanism in response to the detected saturation condition.

In a first implementation form of the controller, according to the second aspect as such, the voltage-dependent current source includes an adjustable transconductance for setting a saturation detection threshold.

In a second implementation form of the controller, according to the second aspect as such or any preceding implementation form of the second aspect, the control circuitry is further configured to distinguish between a genuine overload condition and a magnetic tampering attempt based on the outputs of the first and second comparators.

In a third implementation form of the controller, according to the second aspect as such or any preceding implementation form of the second aspect, the control circuitry is further configured to implement a delay between detecting the saturation condition and implementing the protection mechanism.

In a fourth implementation form of the controller, according to the second aspect as such or any preceding implementation form of the second aspect, the protection mechanism comprises increasing a switching frequency of a power switch coupled to the transformer, increasing a drain current of the power switch, or a combination thereof.

In a fifth implementation form of the controller, according to the second aspect as such or any preceding implementation form of the second aspect, the control circuitry is further configured to generate a log entry or alert upon detecting a potential magnetic tampering attempt.

In a sixth implementation form of the controller, according to the second aspect as such or any preceding implementation form of the second aspect, the voltage-dependent current source is configured to be coupled to an auxiliary winding of the transformer.

A third aspect relates to a method for operating a flyback converter. The method comprises monitoring a primary current of a transformer; estimating a primary inductance of the transformer based on a voltage across a reference capacitor; comparing the estimated primary inductance to a saturation threshold; comparing the primary current to an overcurrent protection threshold; detecting a saturation condition based on the comparisons of the estimated primary inductance and the primary current; and implementing a protection mechanism in response to the detected saturation condition.

In a first implementation form of the method, according to the third aspect as such, the method further comprises distinguishing between a genuine overload condition and a magnetic tampering attempt based on the comparisons of the estimated primary inductance and the primary current.

In a second implementation form of the method, according to the third aspect as such or any preceding implementation form of the third aspect, implementing the protection mechanism comprises increasing a switching frequency of a power switch coupled to the transformer, increasing a drain current of the power switch, or a combination thereof.

In a third implementation form of the method, according to the third aspect as such or any preceding implementation form of the third aspect, the method further comprises implementing a delay between detecting the saturation condition and implementing the protection mechanism.

In a fourth implementation form of the method, according to the third aspect as such or any preceding implementation form of the third aspect, the method further comprises generating a log entry or alert upon detecting a potential magnetic tampering attempt.

In a fifth implementation form of the method, according to the third aspect as such or any preceding implementation form of the third aspect, the method further comprises adjusting a transconductance of a voltage-dependent current source coupled to the reference capacitor to set a saturation detection threshold.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A flyback converter, comprising:

a transformer having a primary winding and a secondary winding;

a power switch coupled to the primary winding, wherein a primary current is flowing through the primary winding of the transformer; and a controller coupled to the power switch, the controller comprising:

a voltage-dependent current source, a reference capacitor coupled to the voltage-dependent current source, a first comparator configured to compare a voltage across the reference capacitor to a saturation threshold voltage, a second comparator configured to compare a sense voltage, representative of the primary current, to an overcurrent protection threshold voltage, and logic circuitry configured to generate a trigger signal based on outputs of the first and second comparators, wherein the controller is configured to:

estimate a primary inductance of the transformer based on the voltage across the reference capacitor, detect a saturation condition based on the estimated primary inductance and the primary current, and implement a protection mechanism in response to the detected saturation condition.

2. The flyback converter of claim 1, wherein the transformer further comprises an auxiliary winding, and wherein the voltage-dependent current source is coupled to the auxiliary winding.

3. The flyback converter of claim 2, further comprising a resistor coupled between the auxiliary winding and the voltage-dependent current source.

4. The flyback converter of claim 1, wherein the protection mechanism comprises increasing a switching frequency of the power switch.

5. The flyback converter of claim 1, wherein the controller is further configured to distinguish between a genuine overload condition and a magnetic tampering attempt based on the outputs of the first and second comparators.

6. The flyback converter of claim 1, wherein the controller is further configured to implement a delay between detecting the saturation condition and implementing the protection mechanism.

7. The flyback converter of claim 1, wherein the controller is further configured to generate a log entry or alert upon detecting a potential magnetic tampering attempt.

8. A controller for a flyback converter, the controller comprising:

a voltage-dependent current source;

a reference capacitor coupled to the voltage-dependent current source;

a first comparator configured to compare a voltage across the reference capacitor to a saturation threshold voltage;

a second comparator configured to compare a primary current to an overcurrent protection threshold, wherein the primary current is flowing through the primary winding of a transformer of the flyback converter; and logic circuitry configured to generate a trigger signal based on outputs of the first and second comparators; and wherein the controller is configured to:

estimate a primary inductance of the transformer based on the voltage across the reference capacitor, detect a saturation condition based on the estimated primary inductance and the primary current, and implement a protection mechanism in response to the detected saturation condition.

9. The controller of claim 8, wherein the voltage-dependent current source includes an adjustable transconductance for setting a saturation detection threshold.

10. The controller of claim 8, wherein the controller is further configured to distinguish between a genuine overload condition and a magnetic tampering attempt based on the outputs of the first and second comparators.

11. The controller of claim 8, wherein the controller is further configured to implement a delay between detecting the saturation condition and implementing the protection mechanism.

12. The controller of claim 8, wherein the protection mechanism comprises increasing a switching frequency of a power switch coupled to the transformer, increasing a drain current of the power switch, or a combination thereof.

13. The controller of claim 8, wherein the controller is further configured to generate a log entry or alert upon detecting a potential magnetic tampering attempt.

14. The controller of claim 8, wherein the voltage-dependent current source is configured to be coupled to an auxiliary winding of the transformer.

15. A method for operating a flyback converter, the method comprising:

monitoring a primary current of a transformer;

estimating a primary inductance of the transformer based on a voltage across a reference capacitor;

comparing the estimated primary inductance to a saturation threshold;

comparing the primary current to an overcurrent protection threshold;

detecting a saturation condition based on the comparisons of the estimated primary inductance and the primary current; and implementing a protection mechanism in response to the detected saturation condition.

16. The method of claim 15, further comprising distinguishing between a genuine overload condition and a magnetic tampering attempt based on the comparisons of the estimated primary inductance and the primary current.

17. The method of claim 15, wherein implementing the protection mechanism comprises increasing a switching frequency of a power switch coupled to the transformer, increasing a drain current of the power switch, or a combination thereof.

18. The method of claim 15, further comprising implementing a delay between detecting the saturation condition and implementing the protection mechanism.

19. The method of claim 15, further comprising generating a log entry or alert upon detecting a potential magnetic tampering attempt.

20. The method of claim 15, further comprising adjusting a transconductance of a voltage-dependent current source coupled to the reference capacitor to set a saturation detection threshold.

* * * * *